United States Patent [19]

Hino

[11] Patent Number: 4,713,649
[45] Date of Patent: Dec. 15, 1987

[54] BIAS VOLTAGE COMPENSATED INTEGRATED CIRCUIT DIGITAL-TO-ANALOG CONVERTER

[75] Inventor: Youzi Hino, Kawasaki, Japan

[73] Assignee: Fujitsu Limited, Kawasaki, Japan

[21] Appl. No.: 847,093

[22] Filed: Apr. 2, 1986713649433003H03M1/66

[51] Int. Cl.[4] ............................................. H03M 1/66
[52] U.S. Cl. .............................................. 340/347 DA
[58] Field of Search ................................. 340/347 DA

[56] References Cited

U.S. PATENT DOCUMENTS

| | | | |
|---|---|---|---|
| 3,541,354 | 11/1970 | Basham | 340/347 DA |
| 3,832,707 | 8/1974 | Buchanan | 340/347 DA |
| 4,138,667 | 2/1979 | Vogel | 340/347 DA |
| 4,381,499 | 4/1983 | Struthoff | 340/347 DA |
| 4,415,883 | 11/1983 | Sichart | 340/347 DA |

FOREIGN PATENT DOCUMENTS

| | | |
|---|---|---|
| 83307559 | 5/1986 | European Pat. Off. . |
| 3036074 | 5/1982 | Fed. Rep. of Germany ...... 340/347 DA |
| 3114110 | 11/1982 | Fed. Rep. of Germany ...... 340/347 DA |
| 2288424 | 5/1976 | France . |
| 0051853 | 4/1977 | Japan ........................... 340/347 DA |

OTHER PUBLICATIONS

Price, "A Passive Laser-Trimming Technique to Improve the Linearity of a 10-Bit D/A Converter", *IEEE Journal of Solid State Circuits*, vol. SC-11, No. 6, Dec. 1976, pp. 789-794.

*Primary Examiner*—Charles D. Miller
*Attorney, Agent, or Firm*—Staas & Halsey

[57] ABSTRACT

A digital-to-analog converter comprising a ladder circuit resistance network and switching means comprising p-channel and n-channel MOS transistors. The distortion of analog signals generated by non-linear characteristics of resistors fabricated using p-channel or n-channel materials in the semiconductor are improved by replacing an inverter element module of the ladder circuit with T-type inverter circuit element module, and adjusting the resistance value of both the side branches of the T-type circuit.

13 Claims, 8 Drawing Figures

BIAS VOLTAGE COMPENSATED INTEGRATED CIRCUIT DIGITAL-TO-ANALOG CONVERTER

This is a continuation of co-pending application Ser. No. 566,878 filed on Dec. 29, 1983 (now abandoned).

BACKGROUND OF THE INVENTION

1. Field of the Invention

The present invention relates to a digital-to-analog converter and, more particularly, to the reduction of distortion in the output signal of a digital-to-analog converter which is fabricated as an integrated circuit (IC). The present invention is intended to eliminate the effect of a bias voltage applied to a substrate of a ladder circuit type (R-2R ladder type network) digital-to-analog converter (D/A converter).

2. Description of the Prior Art

Many D/A converters have been proposed that convert digital signals to analog signals and which are principally ladder circuits, as illustrated in the block diagram of FIG. 1. When an input digital signal consisting of bit signals $A_0, A_1, A_2, \ldots, A_n$ is applied to the circuit, each bit signal controls a corresponding switch $I_0, I_1, I_2, \ldots, I_n$ consisting of, for example, an inverter I, and a reference voltage $V_{REF}$ or a ground voltage is connected to an output terminal $V_{out}$ through the switches $I_0, I_1, I_2, \ldots, I_n$. The ladder circuit 1 in FIG. 1 is constructed of two resistors R and 2R, connected as shown. The resistance of resistors 2R is twice that of resistors R and such a ladder circuit is called an R-2R ladder network. The combined impedance at each branch point or connection point of the ladder circuit 1, looking toward the right in FIG. 1, is equal to R, so, if each of the branches 2R are connected to a reference voltage source $V_{REF}$ through the switches, the output voltage $V_{out}$ can be written as $$V_{out} = V_{REF}(A_0/2 + A_1/2^2 + A_2/2^3 + \ldots + A_n/2^n) \quad (1)$$

As can be seen from FIG. 1 and the above equation, each bit applied to each switch contributes to the output voltage in correspondence with the order of significance for that bit. $A_0$ is the most significant bit (MSB), and the bit $A_n$ is the least significant bit (LSB).

FIG. 2 illustrates an example of a circuit diagram of the circuit of FIG. 1. The circuit is constructed as a ladder circuit, consisting of resistors R and 2R, and inverter circuits $I_0, I_1, I_2, \ldots, I_n$ consisting of complementary MOS (metal oxide semiconductor) transistors. Each inverter circuit has an input terminal $A_0, A_1, A_2, \ldots, A_n$, and each consists of both p-type and n-type MOS transistors, having gate electrodes connected to each other and to the respective input terminal. Drain electrodes of the p-type MOS transistor and the n-type MOS transistor are connected to each other at a connection point 0 which is connected to the respective 2R resistor. Source electrodes of the p-type MOS transistor and the n-type MOS transistor are connected respectively to reference voltage $V_{REF}$ and ground, respectively. The other side of each resistor 2R is linked to each connection point of series connected resistors R and the end of the ladder circuit is grounded through a resistor 2R. An input digital signal which is usually stored in a register or supplied directly from a logic circuit is applied to the D/A converter circuit and each bit is separately supplied to each input terminal A of the respective inverter circuit I. The same notation is used for each input terminal and each bit of the digital input signal $(A_0, A_1, A_2, \ldots, A_n)$. The first bit $A_0$ (that is the MSB) is supplied to the first inverter circuit $I_0$, and the second most significant bit $A_1$ is supplied to the second inverter circuit $I_1$, and so forth, and the least significant bit $A_n$ is supplied to the last switching inverter circuit $I_n$. When the input terminals of the inverters are supplied with "0" or "1" signals corresponding to the code of the input signal, each inverter supplies, corresponding to each input signal, the reference voltage $V_{REF}$ or the ground voltage to the respective series resistor junction point through resistor 2R.

For example, if the input signal is $1,1,1,\ldots,1$, that is if all bits are "1", $(A_0 = A_1 = A_2 = \ldots = A_n = 1$, all inverters are supplied with a "1" signal, and the gate potential of all transistors is high. The p-channel type MOS transistors (p-MOS) are "off", the n-channel type MOS transistors (n-MOS) are "on" and the connection points 0 are at the ground potential. If the input signal is $0,0,\ldots,0$, all inverters are supplied with a "0" signal, and the gate potential of all transistors is low. The p-MOS transistors are "on", the n-MOS transistors are "off" and and the connection points 0 are at the reference voltage $V_{REF}$. The output voltage $V_{out}$ is the accumulation or sum of the potential of each series resistor connection point according to the weight of each corresponding bit as expressed mathematically by equation (1).

FIG. 3, including FIG. 3(a) and 3(b), illustrates an example of a resistance fabricated in a semiconductor which is widely used as the resistances of the resistors in the D/A converter. FIG. 3(a) illustrates a cross-sectional view of a resistor, and FIG. 3(b) illustrates a plan view of a plurality of the resistors showing their alignment. A substrate 2 of an IC die (or chip) is made from, for example, an n-type silicon. As would be recognized by a person of skill in the art, the substrate may be of a p-type silicon or any other type semiconductor material. However, the description herein will be made with respect to an n-type silicon substrate. If another material is substituted, the needed modifications of the present invention will be possible by a person of skill in the art. The process for fabricating the resistors is known by those of skill in the art, does not relate directly to the present invention and will be explained only briefly to describe the structure of the resistor. After the fabrication of a field oxide layer 3, a P-type well 4 is formed in the substrate 2. In the P-well 4, terminal electrodes 5 are fabricated by diffusion with a very high dose of an n-type dopant. Such a very high doped region is often called an N++ region. Fabricated between the N++ regions is a region N+6 which is highly doped with n-type dopant and forms the resistor. These resistors have a strip type configuration and are arranged in parallel with each other as shown in FIG. 3(b). The resistance value of a resistor is determined by the size of the strips and the resistivity of the N+ region in accordance with $$R = R_a \, l/w \quad (2)$$

where $R_a$ is the sheet resistivity of the N+ region, 1 is the length of the resistor strip and w is the width of the diffusion layer. The resistors can be fabricated by photo-lithography and a selective diffusion technique for example, both fundamental, well known processes in semiconductor manufacturing.

Generally the resistance value of each resistor is fabricated as equal to R and to form resistors of 2R in the resistance network, two resistors are connected in series. Sometimes the resistance value is fabricated as equal to 2R, and resistor R is made by connecting two resistors in parallel and these two methods are the preferable ones for fabricating a precise value of R and 2R.

After the resistors 6 are fabricated, the surface of the substrate is coated with a phospho-silicate glass (PSG) layer 7 used for surface passivation. Contact windows are opened at proper positions on the PSG layer 7, and the circuit is completed by connecting these resistors using aluminum wiring 8 and 9, as shown in FIG. 3(a). In FIG. 3(b), the aluminum wiring 8 and 9, and the PSG layer 7 are not shown to clearly show the alignment of the resistor strips.

In order to integrate such a D/A converter into an IC, it is necessary to fabricate the resistors very precisely which increases the difficulty of manufacturing and decreases the yield. However, a more significant problem is that the resistance value of each resistor is varied by a bias voltage applied to the substrate of the IC which is an inevitable and inherent characteristic of a MOS device.

Usually one of the highly doped N++ regions of an n-type resistor (which is made of an n-type conductivity semiconductor), suitable for a CMOS (complementary MOS) transistor, is used to supply a bias voltage to the substrate. For example, as shown in FIG. 3(a), the substrate is biased with 5 volts through the electrode 8 and the electrode 9 is grounded. With respect to the substrate 2, the potential of the electrode 8 is zero and the potential of electrode 9 is −5 volts.

It is well known in the art that the resistivity of a channel of n-type conductivity varies as shown by curve 10 in FIG. 4, when the bias voltage is varied. This variation is due to the variation of the channel depth caused by the bias voltage. The details of this phenomena are described, for example, in *Analog Integrated Circuit Design* by A. B. Grebne, published in 1972 by Litton Educational Publishing Inc. The sheet resistivity of the portion of the resistor (N+ layer) closest to the electrode 8, where it is biased nearly to 0 volts with respect to the substrate 2, is low (see 11 in FIG. 4), while the sheet resistivity of the portion of the resistor closest to the electrode 9, where it is biased −5 volt wth respect to the substrate 2, is high (see 12 in FIG. 4). The sheet resistivity between the electrodes 8 and 9, varies from the low value at 11 gradually to the high value at 12, as the measurement point moves from electrode 8 to electrode 9. It is, therefore, difficult to precisely fabricate the resistors R and 2R as determined by equations (1) and (2), because they are affected by the bias voltage applied to the substrate.

A D/A converter as in FIG. 2 having a resistor network fabricated in the same IC substrate, has non-linear input-output characteristics as illustrated by curve 13 in FIG. 5. Curve 13 illustrates the characteristics of a D/A converter having an n-type conductivity resistance network. It will be understood by those of skill in the art that a D/A converter having a p-type conductivity resistance network has characteristics like curve 14 in FIG. 5. The characteristics of curves 13 and 14 are reversed with respect to each other because the p-type conductivity and n-type conductivity are performed by holes and electrons respectively. The non-linear characteristics illustrated are almost an inherent defect of an integrated circuit type D/A converters consisting of a semiconductor ladder type network and the non-linearity of the analog output signal as compared to the digital input signal is inevitable in prior art D/A converters.

SUMMARY OF THE INVENTION

An object of the present invention, therefore, is to provide an integrated circuit D/A converter having an improved linearity in the analog output signal as compared to the digital input signal.

Another object of the present invention is to provide a method for improving the non-linear characteristics of a D/A converter in a simple and easy manner.

A further object of the present invention is to provide a D/A converter which is easy to manufacture and increases the production yield.

The foregoing objects of the invention are attained by dividing the pair of complementary MOS transistors in ladder type circuit of a D/A converter, into p-type and n-type MOS transistors, and providing each transistor with a resistance having a different value. The D/A converter of the present invention applies such divided CMOS (complementary MOS) transistor pairs to the switching of the most significant bit (MSB) and if necessary, the divided CMOS circuit pairs are applied to the switching circuits of lesser significance than the MSB. Adjustment of the resistance to reduce the non-linearity of the D/A converter is done by changing the length or width of resistors included in above-mentioned divided CMOS circuit pairs.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

Figure 6:
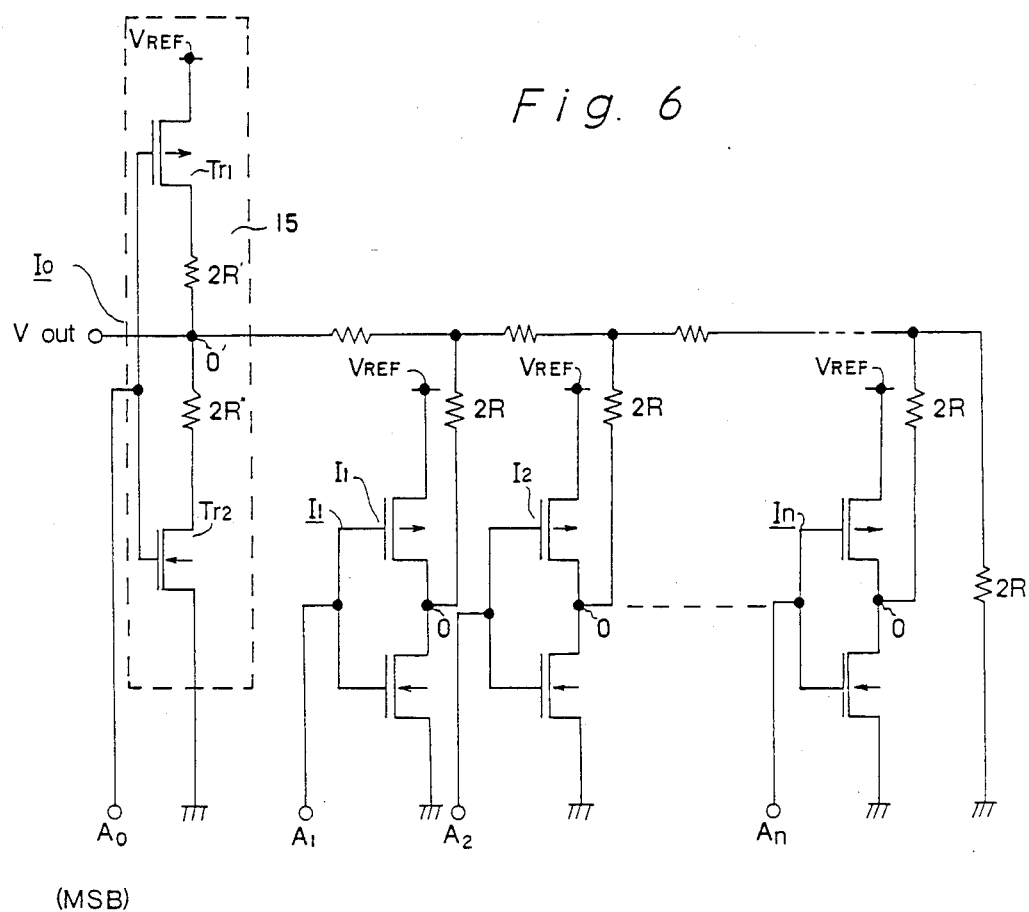
FIG. 6 is a circuit diagram of a D/A converter according to one embodiment of the present invention.

The present invention is intended to provide a D/A converter having improved linearity in its analog output signal as compared to its digital input signal. FIG. 6 illustrates a circuit diagram for one embodiment of the present invention. Comparing FIG. 6 to FIG. 2, the difference resides in the first inverter $I_0$ (shown in a dashed square 15), while the remainder of the circuit is the same as that in FIG. 2. The inverter circuit module inside the dashed line 15 is applied to the variations of the present invention, as will be described hereinafter.

According to the present invention, connected between the complementary MOS (CMOS) transistor pair $T_{r1}$ and $T_{r2}$, comprising the first inverter $I_0$, are connected to two resistors 2R' and 2R''. A drain electrode of p-MOS (p-type MOS) transistor $T_{r1}$ is connected to the resistor 2R', and a drain electrode of n-MOS (n-type MOS) transistor $T_{r2}$ is connected to the resistor 2R''. Gate electrodes of both transistors $T_{r1}$ and $T_{r2}$ are connected to each other, and commonly connected to the input terminal $A_0$ which receives the MSB (most significant bit). A source electrode of the first transistor $T_{r1}$ is connected to the reference voltage $V_{REF}$, and a source electrode of the second transistor $T_{r2}$ is connected to ground. A connection point 0' (the junction point of resistors 2R' and 2R'') is connected to the remainder of the series resistance network and the output terminal. As previously mentioned, in the circuit of FIG. 2, the output signal is supplied through the resistor 2R when the p-MOS transistor is "on" or when the n-MOS transistor is "on". In contrast, in the circuit of FIG. 6, when the transistor $T_{r1}$ is on, the output signal is supplied through the first resistor 2R', and when the transistor $T_{r2}$ is "on", the output signal is supplied through the second resistor 2R''. If the resistances of 2R' and 2R'' are adjusted beforehand to compensate for the effect of the bias voltage, it is possible to eliminate the non-linear effects due to the bias voltage. For example, when the p-MOS transistor $T_{r1}$ is "on", resistance of resistor 2R' shifts to the right on curve 14 in FIG. 5, so the adjustment beforehand should be to reduce the resistance of 2R'. In contrast, when the n-MOS transistor $T_{r2}$ is "on", the resistance of the resistor 2R'' shifts to the left on curve 13, the beforehand adjustment, therefore, should be to increase the resistance of 2R''. Since the circuit is driven digitally on and off, the bias voltage for the resistors 2R' and 2R'' is a fixed and stable value. These fixed values are determined by the circuit design, are known beforehand and so it is easy to adjust these resistors by simply adjusting the length or width of the resistor strips. Of course, as understood by those of skill in the art, it is possible to adjust the resistance by varying the diffusion dose.

Figure 5:
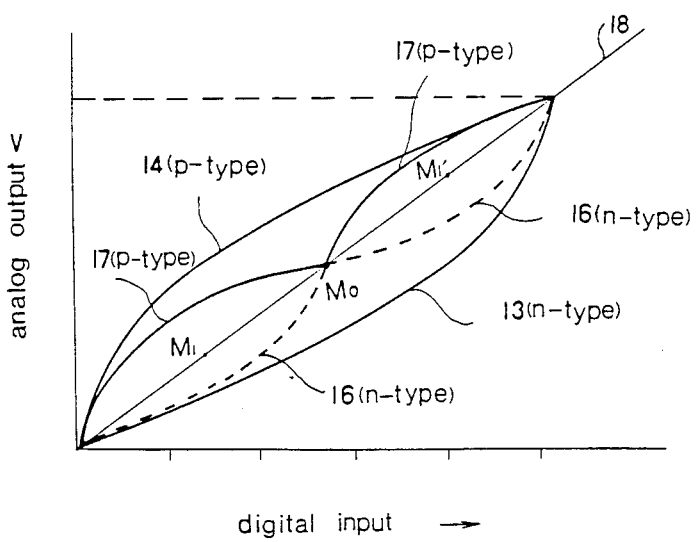
FIG. 5 is a graph comparing an analog output voltage signal to a digital input signal, and comparing the improved characteristics of the present invention to those of the prior art converter circuits.

In FIG. 6, the invention is applied only to the first inverter $I_0$, which adjusts the most significant bit and is very effective for improving the linearity of the MSB because, as can be seen from equation (1), the effect of the MSB is equal to the total effect of the remaining bits. FIG. 5 illustrates the improved characteristics of a D/A converter in which the improvement according to the present invention is applied only to the MSB, namely the improvement is only in the first inverter circuit $I_0$. FIG. 5 illustrates the output analog voltage signals as compared to input digital signals, and as compared to the output produced by the prior art circuit. Curve 17 depicts the improved characteristics of a D/A converter using a p-type conductive resistance network, and dotted curve 16 depicts the improved characteristics of a D/A converter using an n-type conductive resistance network, while the curves 13 and 14 show respectively, the characteristics of an unimproved D/A converter using an n-type and p-type conductive resistance network. As previously mentioned, the effect of the MSB improvement is equal to the total effect of the 65 remaining bits, the curve 16 and 17 coincide with straight line 18, which depicts the ideal characteristics, at a middle point $M_0$. The gap between the line 18 and the curves 16 or 17 is due to the effect of the remaining bits which have not been improved. The improved circuit using p-type conductive resistors or n-type conductive resistors show two upward convex portions or two upward concave portions respectively. The difference between the p-type conductive resistance network and the n-type conductive resistance network is due to the fact, that the conductivity of the former is controlled by holes, while the conductivity of the latter is controlled by electrons.

As can be understood from the above explanation, if the circuit of the present invention is also applied to the second inverter $I_1$, the linearity of the analog output signal is further improved. In this case the curves corresponding to the curves 16 and 17 will coincide with the ideal line 18 at three points, that is, at point $M_0$, the point improved by the modified inverter $I_0$, and two more points $M_1$ and $M_1'$, each located in the middle of the loop made by curves 16 and 17, as illustrated in FIG. 5. This type of improvement can be extended to lesser significant bits and as the number of inverters including the improvement according to the present invention increase, the number of points which coincide with the ideal line increases proportionally to the square of the number of inverters which include the improvement, and accordingly, the difference between the ideal output and the actual output decreases. The improvement, preferably, should be applied to the inverters in the order of those located nearer to the output terminal to those located farther from the output terminal, that is, the following order of application $I_0, I_1, I_2, \ldots, I_n$, since, as can be recognized from equation (1), the effectiveness of the improvement is related to the order of significance of the bits.

Figure 3A:
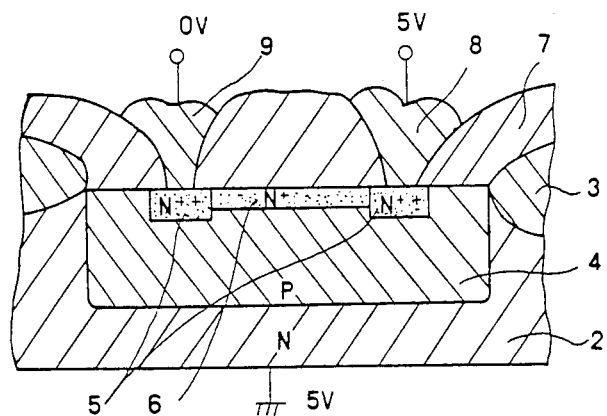
FIG. 3(a) is a cross-sectional view of a substrate illustrating the structure of the resistor used in a circuit of FIG. 2.
Figure 3B:
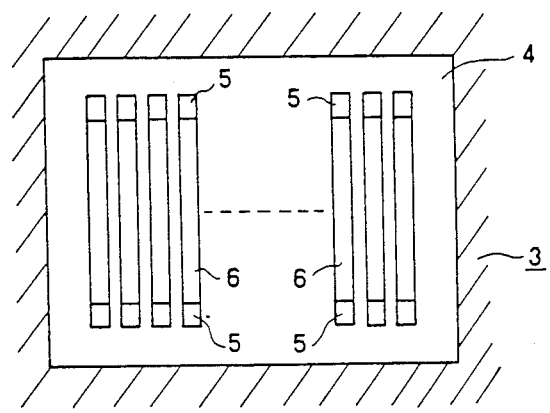
FIG. 3(b) is a plan view of the resistors used in the circuit of FIG. 2.
Figure 7:
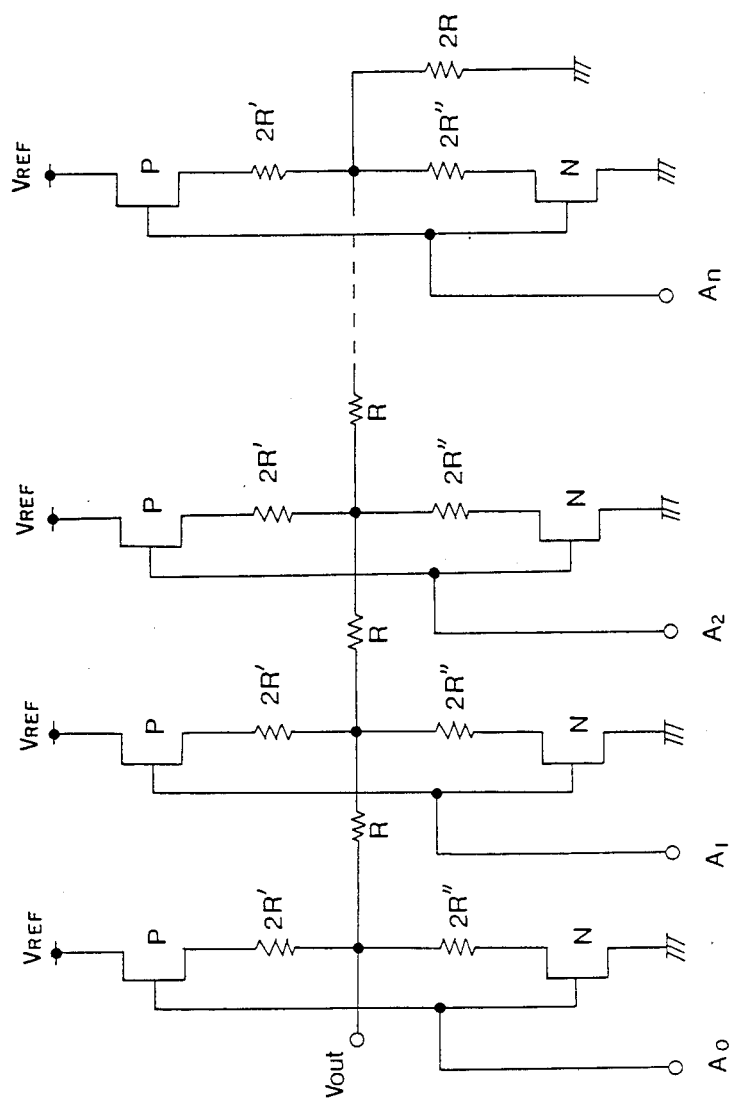
FIG. 7 is a circuit diagram of a D/A converter according to another embodiment of the present invention.

FIG. 7 illustrates another embodiment of the present invention in which the above described improvement (inverter circuit module 15 in FIG. 6) has been applied to all stages of the ladder circuit. In this case all the resistors can be divided into two groups of 2R' and 2R'' resistors, except the termination resistor 2R. It is easy to adjust all the resistors at the same time with one process. Many variations in the practice of this invention will occur to those skilled in the art, for example, elongating half the number of resistor strips of FIG. 3(b), or broadening half the number of resistor strips. All of these modifications are within the spirit and scope of the present invention. In addition, the termination resistor 2R can be substituted for 2R' and 2R'' because the effect caused by the termination resistor is very small, and the difference caused by its resistance is negligible.

Figure 1:
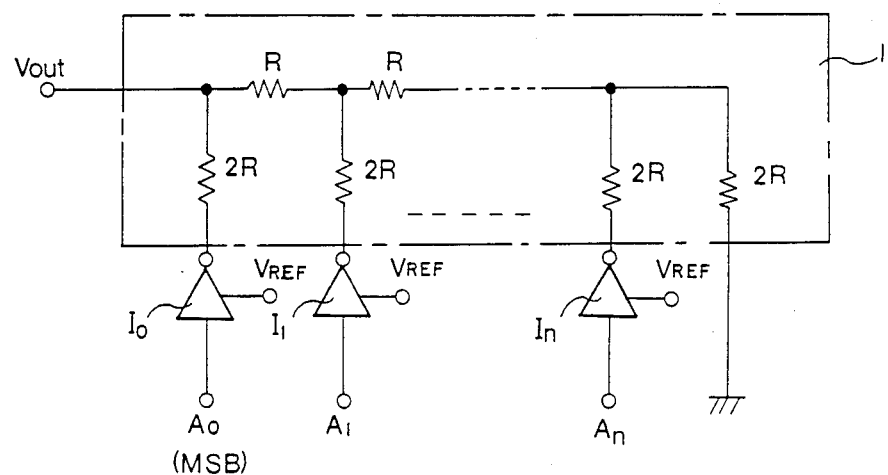
FIG. 1 is a block diagram of a prior art D/A converter circuit.
Figure 2:
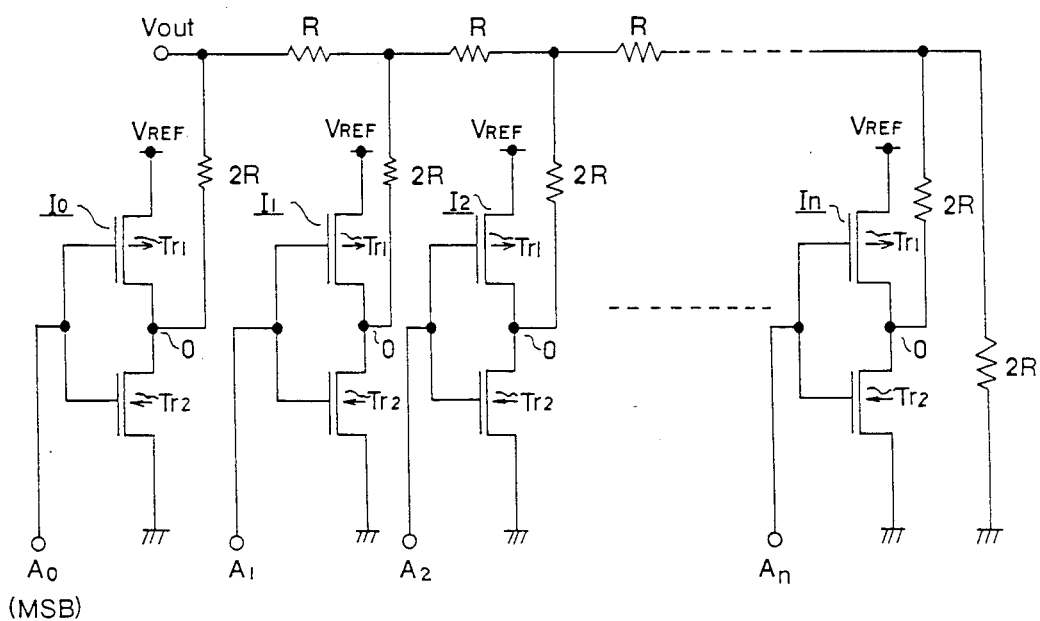
FIG. 2 is a circuit diagram of the D/A converter of FIG. 1 integrated onto an IC.
Figure 4:
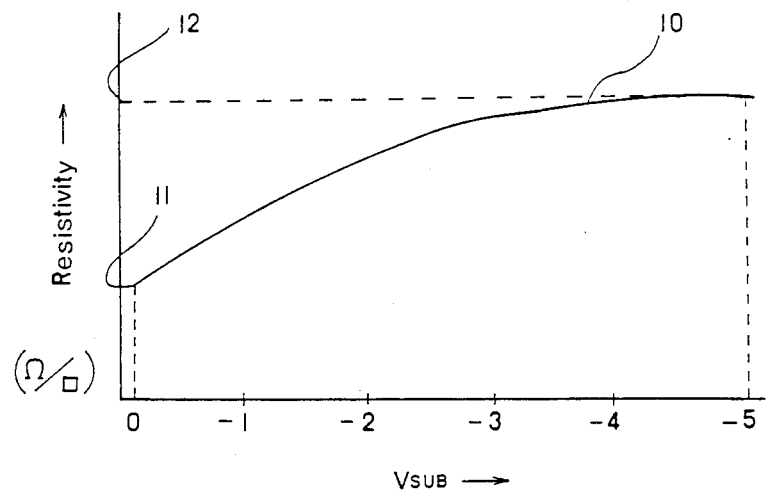
FIG. 4 is a graph of the general characteristics of a resistor made from a conductive layer of a semiconductor, illustrating the variation of resistivity according to an applied bias voltage.

An example of the adjustment performed on a resistor will be provided hereinafter. In the prior art D/A converter circuit as illustrated in FIG. 2, the resistances of the R and 2R resistors were respectively 25 K$\Omega$ and 50 K$\Omega$. These resistors were fabricated in strip form 10 $\mu$m wide, 250 $\mu$m long, and 10 $\mu$m wide, 500 $\mu$m long, respectively. The sheet resistivity was 1 K$\Omega$ square for both resistors. Adjustment was done following a measurement of curves similar to that in FIG. 4, and performance of the appropriate calculations. The length for the resistor strips of 2R' and 2R'' shown in FIG. 6 was adjusted to 485 $\mu$m and 520 $\mu$m respectively, while, the width and the sheet resistivity was not changed. The adjustment of the resistance corresponds to 3% for 2R' and 4% for 2R'', respectively. The curves illustrated in FIG. 5 were measured using a circuit as in FIG. 6 having the above described resistances.

As can be seen from the above description, the improvement of the circuit can be applied to any stage of the ladder circuit, however, the improvement should be done in a stage order corresponding to the significance of the bits. Increasing the number of improved stages will provide better linearity, but it increases the variety in the resistors and the difficulty of circuit design. In a practical application, a balance should be found between the required linearity and circuit complexity or price.

The description herein has been with respect to a silicon substrate, as recogized by those of skill in the art, the circuit of the present invention can be applied to materials other than silicon. Many variations of the invention may occur to those skilled in the art, for example, replacing MOS transistors by some other switching devices, or replacing the p-MOS and n-MOS transistors in the drawings with each other, but such variations are within the scope and spirit of the present invention.

What is claimed is:

1. An integrated circuit digital-to-analog converter formed on a substrate receiving a bias voltage, comprising:
   an output terminal providing an analog output of said digital-to-analog converter;
   a resistor network operatively connected to said output terminal and comprising series connected first resistors connected to said output terminal at one end and forming connection points therebetween and each resistor having a resistance R, a terminal resistor having a resistance 2R connected to the other end of said series connected first resistors forming another connection point, and second resistors each having a resistance 2R and connected respectively to the connection points; and
   inverter modules receiving a bit of a digital input signal, all but at least one of said inverter modules connected to said second resistors and providing first and second voltages to corresponding connection points, the at least one inverter module being connected to said output terminal and comprising:
   first and second transistors connected to receive the corresponding bit of the digital input signal;
   a third resistor connected between said first transistor and the output terminal and having a resistance approximately equal to but less than 2R; and
   a fourth resistor connected between said second transistor and the output terminal and having a resistance approximately equal to but greater than 2R.

2. A converter as recited in claim 1, wherein said at least one inverter module is connected to receive the most significant bit of said digital signal.

3. A converter as recited in claim 1, wherein said first transistor is a P-type MOS transistor and said second transistor is an N-type MOS transistor.

4. A converter as recited in claim 1, wherein both of said first and second transistors include a gate operatively connected to receive the bit, said first transistor has a source operatively connected to a reference voltage and a drain operatively connected to said first resistor, and said second transistor has a drain connected to said second resistor and a source connected to ground.

5. A converter as recited in claim 1, wherein said first and second resistors are P-type resistors, the resistance of said first resistor is lower than that of said second resistor and the resistance of said second resistor is larger than that of said termination resistor.

6. A converter as recited in claim 1, wherein said first and second resistors are N-type resistors, the resistance of said first resistor is higher than that of said second resistor and the resistance of said second resistor is lower than that of said termination resistor.

7. A converter as recited in claim 1, wherein said network resistors, said termination resistor and said first and second resistors comprise resistor strips formed in the integrated circuit oriented parallel to each other.

8. An integrated circuit digital-to-analog converter, comprising:
   a substrate receiving a bias voltage;
   a resistor network formed on said substrate and comprising network resistors operatively connected in series and forming connection points therebetween, each network resistor having a resistivity varying in accordance with the applied bias voltage;
   a termination resistor formed on said substrate and operatively connected to one end of said resistor network; and
   switching and compensation means, formed on said substrate and operatively connected to the other end of said resistor network and to the connection points of said resistor network, for receiving a digital signal and converting the digital signal to voltages applied to said resistor network, the voltages compensating for the variance in the resistivity of the network resistors caused by said bias voltage.

9. A converter as recited in claim 8, wherein said switching and compensation means comprises switching modules, one connected to the other end of said resistor network and the remaining switching modules connected to the connection points of said resistor network, each of said switching modules comprising:
   first and second transistors operatively connected to receive one bit of the digital signal; and
   compensation means, operatively connected to said first and second transistors and said resistor network, for applying first and second voltages to said resistor network in dependence upon the value of the bit of the digital signal where the first and second voltages compensate for the bias voltage.

10. A converter as recited in claim 9, wherein said compensation means comprises:
    a first resistor operatively connected to said first transistor and said resistor network, and having a first resistance; and
    a second resistor operatively connected to said second transistor and said resistor network, and having a second resistance, where the first and second resistances are approximately equal but different and compensate for the bias voltage.

11. A converter as recited in claim 10, wherein the resistance of said first and second resistors is approximately equal to but different from a resistance of said termination resistor and approximately equal to but different from twice a resistance of each of said network resistors.

12. An integrated circuit digital-to-analog converter formed on a substrate receiving a bias voltage, comprising:
    a resistor network comprising network resistors operatively connected in series and forming connection points therebetween;

a termination resistor operatively connected to one end of said resistor network;

switching means, operatively connected to the other end of said resistor network and to the connection points of said resistor network, for receiving a digital signal and converting the digital signal to voltages applied to said resistor network, said switching means comprising switching modules, one connected to the other end of said resistor network and the remaining switching modules connected to the connection points of said resistor network, each of said switching modules comprising:

first and second transistors operatively connected to receive one bit of the digital signal, said first transistor comprising a semiconductor material selected from one of an N-type semiconductor material and a P-type semiconductor material, and said second transistor comprising the other type semiconductor material; and compensation means, operatively connected to said first and second transistors and said resistor network, for applying first and second voltages to said resistor network in dependence upon the value of the bit of the digital signal where the first and second voltages compensate for the bias voltage, said compensation means comprising:

a first resistor operatively connected to said first transistor and said resistor network, and having a first resistance; and a second resistor operatively connected to said second transistor and said resistor network, and having a second resistance, where the first and second resistance are approximately equal but different and compensate for the bias voltage, the resistance of said first and second resistors is approximately equal to a resistance of said termination resistor and twice a resistance of each of said network resistors.

13. An integrated circuit digital-to-analog converter having an output terminal and formed on a substrate having a conductivity type and having a bias voltage applied thereto, said converter comprising:

a termination resistor;

a plurality of first resistors having a first resistance operatively connected in series between said termination resistor and the output terminal and forming connection points therebetween; and inverters, each operatively connected to respective connection points and to receive a single bit of a digital signal, and at least one inverter comprising:

a first transistor of a first conductivity type operatively connected to a first power supply and to receive the single bit;

a second resistor operatively connected between the first transistor and the respective connection point, having a resistance approximately equal to but less than two times the first resistance and comprising a layer of conductivity opposite to the substrate and having an impurity concentration higher than the substrate;

a second transistor of a second conductivity type operatively connected to a second power supply and to receive the single bit; and a third resistor operatively connected between the second transistor and the respective connection point, having a resistance value approximately equal to but greater than two times the first resistance value and comprising a layer of conductivity opposite to the substrate and having an impurity concentration higher than the substrate.

* * * * *

UNITED STATES PATENT AND TRADEMARK OFFICE
CERTIFICATE OF CORRECTION

PATENT NO. : 4,713,649
DATED : December 15, 1987
INVENTOR(S) : Hino

It is certified that error appears in the above-identified patent and that said Letters Patent is hereby corrected as shown below:

Title page

[22] delete "713649433003H03M1/66"

[30] add --Foreign Application Priority Data

Dec. 29, 1982 [JP]  Japan ..... 57-233909--.

Signed and Sealed this

Nineteenth Day of July, 1988

Attest:

DONALD J. QUIGG

Attesting Officer      Commissioner of Patents and Trademarks